(12) United States Patent
Wu et al.

(10) Patent No.: US 9,806,235 B2
(45) Date of Patent: Oct. 31, 2017

(54) LIGHT EMITTING DIODE BRACKET

(71) Applicant: UNITY OPTO TECHNOLOGY CO., LTD., New Taipei (TW)

(72) Inventors: Ching-Huei Wu, New Taipei (TW); Chih-Chao Chang, New Taipei (TW); Ying-Ju Chen, New Taipei (TW); Ping-Chen Wu, New Taipei (TW)

(73) Assignee: Unity Opto Technology Co., Ltd., New Taipei (TW)

( * ) Notice: Subject to any disclaimer, the term of this patent is extended or adjusted under 35 U.S.C. 154(b) by 279 days.

(21) Appl. No.: 14/730,452

(22) Filed: Jun. 4, 2015

(65) Prior Publication Data
US 2016/0312990 A1 Oct. 27, 2016

(30) Foreign Application Priority Data
Apr. 24, 2015 (TW) .............................. 104206273 U

(51) Int. Cl.
*H01L 33/48* (2010.01)
*H01L 33/62* (2010.01)

(52) U.S. Cl.
CPC ............ *H01L 33/483* (2013.01); *H01L 33/62* (2013.01)

(58) Field of Classification Search
CPC ........ H01L 33/483; H01L 33/60; H01L 33/62
See application file for complete search history.

(56) References Cited

U.S. PATENT DOCUMENTS

| 2008/0151557 A1* | 6/2008 | Su | ............................ | H01L 33/62 |
| | | | | 362/362 |
| 2009/0072256 A1* | 3/2009 | Park | ....................... | H01L 33/483 |
| | | | | 257/98 |
| 2010/0032702 A1* | 2/2010 | Lahijani | .................. | H01L 33/60 |
| | | | | 257/98 |

* cited by examiner

*Primary Examiner* — Phuc Dang
(74) *Attorney, Agent, or Firm* — Rosenberg, Klein & Lee

(57) ABSTRACT

An LED bracket includes a first metal sheet, a second metal sheet and a casing. The casing covers the first and second metal sheets and includes a receiving slot. The casing partially covers the first and second metal sheets. The first metal sheet has a first pin terminal and a first carrying end. The second metal sheet has a second pin terminal and a second carrying end. The non-bent first and second pin terminals are opposite to each other and extended outwardly from the casing. The first and second carrying ends are disposed in the receiving slot and respectively have at least one first support portion and at least one second support portion to enhance the strength of fixing the first and second metal sheets with the casing. The non-bent pins improve the degree of freedom of the design of the casing and the light emission efficiency of LEDs.

2 Claims, 3 Drawing Sheets

LIGHT EMITTING DIODE BRACKET

CROSS-REFERENCE TO RELATED APPLICATIONS

This non-provisional application claims priority under 35 U.S.C. §119(a) on Patent Application No(s). 104206273 filed in Taiwan, R.O.C. on Apr. 24, 2015, the entire contents of which are hereby incorporated by reference.

BACKGROUND OF THE INVENTION

1. Field of the Invention

The present invention relates to the field of light emitting diode (LED) brackets, and more particularly to the LED bracket with a powerful adhesive strength between a metal sheet a nd a casing while maintaining a high emission efficiency of a light emitting diode.

2. Description of the Related Art

LED with the features of good chromaticity, long service life, effective good power saving, excellent environmental friendliness, and small volume gradually replaces traditional light sources, and the LED is used extensively in different areas such as indoor and outdoor illumination lamps, and various types of display panels for mobile phone, backlight source in a screen, and electronic products.

After an LED chip is manufactured, the LED chip is generally packaged to cope with the requirements for different applications and expected effects. In the LED packaging process, the LED chip is adhered to a bracket of at least two metal substrates, and a metal wire is soldered to the two metal substrates by a wire bonding process to form an electric conduction, and finally encapsulation and underfill processes are conducted to protect the LED chip, so that the LED chip may be assembled to form a standalone light emitting source. Basically, the aforementioned steps (including die attach, wire bonding, encapsulation, and underfill) are adopted, even though some LED chips may use a different processing method in the packaging process to meet the requirements of different applications.

The bracket for carrying the LED chip is mainly divided into a condensing type bracket and a wide-angle condensing type bracket, and also divided into a lateral bracket and a direct bracket. In addition to the function of receiving and fixing the LED chip, the design of the bracket also considers factors such as the light emission effect including the angle and brightness after the LED chip is mounted onto the bracket. The conventional LED bracket is covered onto a casing on the outer side of the two metal substrate by an injection molding method, and a pin is extended from the casing separately, and the two pins are bent with respect to the casing. However, the bracket requires the two bent pins, and thus the thickness of the casing is decreased, and the decreased thickness affect the size of a light emission window directly after the LED chip is packaged, and the light emission performance of the LED chip is lowered. To enhance the strength of fixing the two metal substrates with the casing, it is necessary to cover the two metal substrates by the casing completely. As a result, the manufacturing cost and the level of difficulty of molding are increased.

Therefore, the inventor of the present invention invented an LED bracket to overcome the aforementioned drawbacks of the conventional LED bracket.

SUMMARY OF THE INVENTION

In view of the problems of the prior art, it is a primary objective of the present invention to provide an LED bracket to enhance the strength of fixing the metal sheet with the casing covered onto the metal sheet and prevent a bent pin formed by the metal sheet from affecting the thickness of the casing and the size of the light emission window, so as to improve the operation efficiency of the LED.

To achieve the aforementioned and other objectives, the present invention provides an LED bracket comprising a first metal sheet, a second metal sheet and a casing. The casing covers the first metal sheet and the second metal sheet and has a receiving slot. The LED bracket of the invention is characterized in that the casing partially covers the first metal sheet and the second metal sheet, and the first metal sheet has a first pin terminal and a first carrying end, and the second metal sheet has a second pin terminal and a second carrying end, and the first pin terminal and the second pin terminal are non-bent and arranged substantially opposite to each other and extended outwardly from the casing, and the first carrying end and the second carrying end are disposed in the receiving slot, and at least one first support portion and at least one second support portion are provided for enhancing the strength of fixing the first metal sheet and the second metal sheet with the casing.

Wherein, the first support portion and the second support portion are disposed at the bottom of the first carrying end and the second carrying end respectively a nd inwardly and concavely formed. Preferably, the first carrying end and the second carrying end are symmetrically disposed in the receiving slot, and at least one LED chip is installed at the first carrying end or the second carrying end, or jumped across the first carrying end and the second carrying end, so as to enhance the strength of adhering the first metal sheet and the second metal sheet to the casing.

In another preferred embodiment, the present invention provided an LED bracket comprising a first metal sheet, a second metal sheet and a casing, and the casing is coupled to the first metal sheet and the second metal sheet by an injection molding method and has a receiving slot. The LED bracket of the invention is characterized in that the casing partially covers the first metal sheet and the second metal sheet, and the first metal sheet has a first pin terminal and a first carrying end, and the second metal sheet has a second pin terminal and a second carrying end, and the first pin terminal and the second pin terminal arranged substantially opposite to each other and extended outwardly from the casing, and in a non-bent form, and at least one first support portion and at least one second support portion are extended from the first carrying end and the second carrying end respectively, and the first support portion and the second support portion are quadrilateral prism coupled to a sidewall of the casing and protruded out from the casing.

To enhance the overall structural strength and meet the design requirements, the first metal sheet has at least one first auxiliary combining portion, and the second metal sheet has at least one second auxiliary combining portion, and the first auxiliary combining portion and the second auxiliary combining portion are prism having a rectangular cross-section.

In a further preferred embodiment, the present invention provides an LED bracket comprising a first metal sheet, a second metal sheet and a casing, and the casing is coupled to the first metal sheet and the second metal sheet by an injection molding method and has a receiving slot. The LED bracket of the invention is characterized in that the casing partially covers the first metal sheet and the second metal sheet, and the first metal sheet has a first pin terminal and a first carrying end, and the second metal sheet has a second pin terminal and a second carrying end, and the first pin terminal and the second pin terminal are extended outwardly from the casing and being in a non-bent form, and the first carrying end and the second carrying end have at least one first support portion and at least one second support portion respectively, and the first support portion and the second support portion are prism which are rectangular prism extended and coupled to a side wall of the casing and protruded out from the casing.

To enhance the overall structural strength and meet the design requirements, the first metal sheet also has at least one first auxiliary combining portion, and the second metal sheet also has at least one second auxiliary combining portion, and the first auxiliary combining portion and the second auxiliary combining portion are prism having a trapezium cross-section similarly.

In summation, the LED bracket of the present invention utilizes the first support portion and the second support portion to make the first metal sheet and the second metal sheet into an irregular shape, so as to enhance the strength of adhering the first metal sheet and the second metal sheet with the casing effectively. In addition, the first pin terminal and the second pin terminal of the present invention are not bent after the injection molding of the casing, so that the casing no longer needs to reserve the space for bending the first pin terminal and the second pin terminal, so that the thickness of the casing may be adjusted as needed. Even if the casing is too thin, the bonding strength and rigidity can be maintained, while preventing the size of the opening of the receiving slot from being affected, no as to provide a better of light emission efficiency of the LED.

DETAILED DESCRIPTION OF THE PREFERRED EMBODIMENTS

The technical content of the present invention will become apparent with the detailed description of preferred embodiments and the illustration of related drawings as follows.

Figure 1:
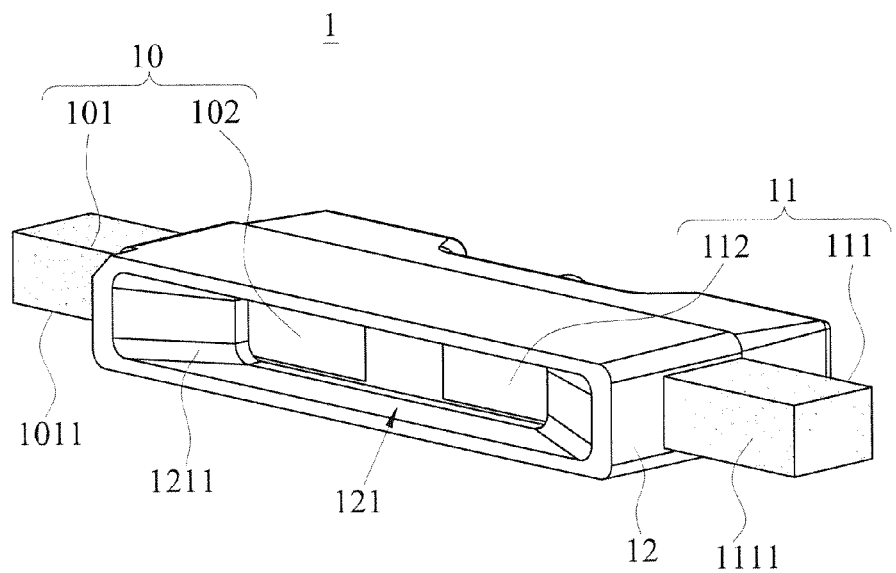
FIG. 1 is a perspective view of a first preferred embodiment of the present invention.
Figure 2:
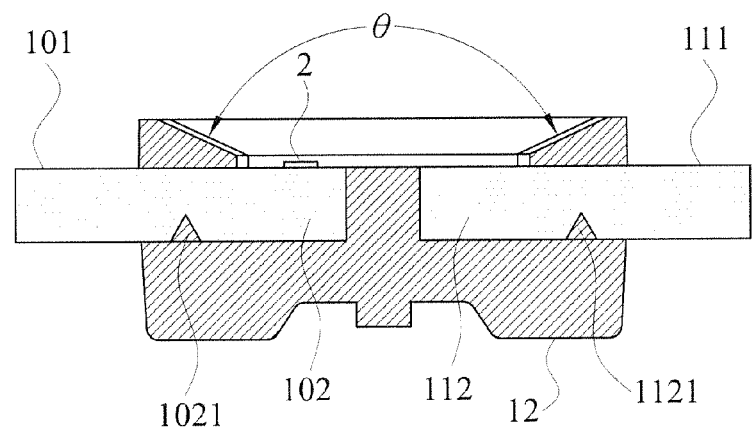
FIG. 2 is a cross-sectional view of the first preferred embodiment of the present invention.

With reference to FIGS. 1 and 2 for a perspective view and across-section view of an LED bracket in accordance with the first preferred embodiment of the present invention respectively, the LED bracket 1 may be a lateral bracket or a direct bracket, and the LED bracket 1 of this embodiment is a lateral bracket. The LED bracket 1 comprises a first metal sheet 10, a second metal sheet 11 and a casing 12, wherein the casing 12 covers the first metal sheet 10 and the second metal sheet 11 by an injection molding method and has a receiving slot 121. The receiving slot 121 has at least one pair of aslant side surfaces 1211 tilted from an opening of the receiving slot 121 to the bottom, and the aslant side surfaces 1211 are disposed opposite to each other, such that the opening of the receiving slot 121 has an included angle θ falling within a range of 110°-150°, and preferably 120°.

The LED bracket 1 is characterized in that the casing 12 partially covers the first metal sheet 10 and the second metal sheet 11, and the first metal sheet 10 has a first pin terminal 101 and a first carrying end 102, and the second metal sheet 11 has a second pin terminal 111 and a second carrying end 112. The first pin terminal 101 and the second pin terminal 111 are arranged opposite to each other and extended outwardly from the casing 12, wherein the pin terminals are not bent, and a conductive layer 1011, 1111 preferably made of silver (Ag) is coated onto the first pin terminal 101 and the second pin terminal 111.

The first carrying end 102 and the second carrying end 112 are disposed in the receiving slot 121 and have at least one first support portion 1021 and at least one second support portion 1121 respectively to enhance the strength of fixing the first metal sheet 10 and the second metal sheet 11. Preferably, the first carrying end 1021 and the second carrying end 1121 are symmetrically disposed in the receiving slot 121, and at least one LED chip 2 is installed at the first carrying end 102 or the second carrying end 112. In this embodiment, the first support portion 1021 and the second support portion 1121 are disposed at the bottom of the first carrying end 102 and the second carrying end 112 and inwardly and concavely formed. Preferably, the first support portion 1021 and the second support portion 1121 are V-shaped elongated groove, so that the plastic materials can be attached closely to the first metal sheet 10 and the second metal sheet 11 in the injection molding process of the casing 12. With the design of the first support portion 1021 and the second support portion 1121, the first metal sheet 10 and the second metal sheet 11 are in an irregular shape to enhance the adhesiveness of the first metal sheet 10 and the second metal sheet 11 with the casing 12, so as to improve the overall structural strength and integration of the LED bracket 1. In the present invention, the first support portion 1021 and the second support portion 1121 enhances the strength of the LED bracket 1, and the structural design of the present invention also prevent the angle θ of the opening of the receiving slot 121 from being affected, so as to provide a wider illumination range size.

Figure 3:
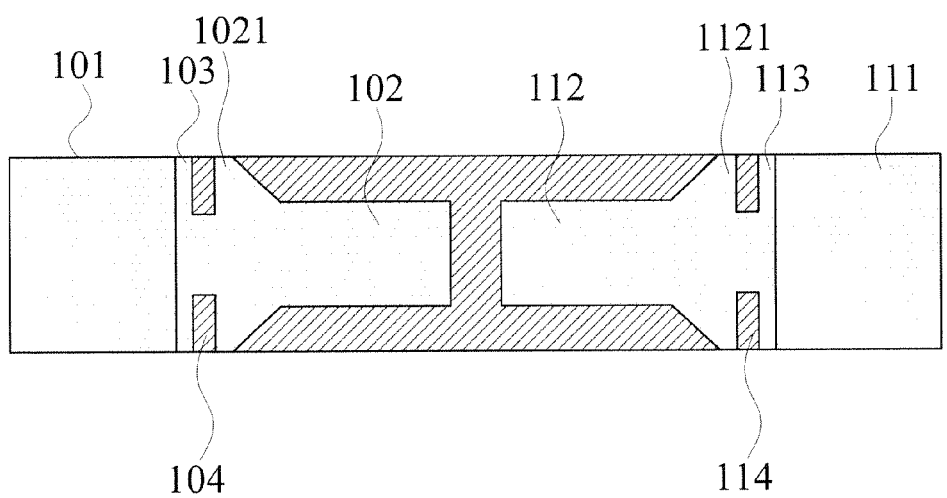
FIG. 3 is a perspective view of a second preferred embodiment of the present invention.
Figure 4:
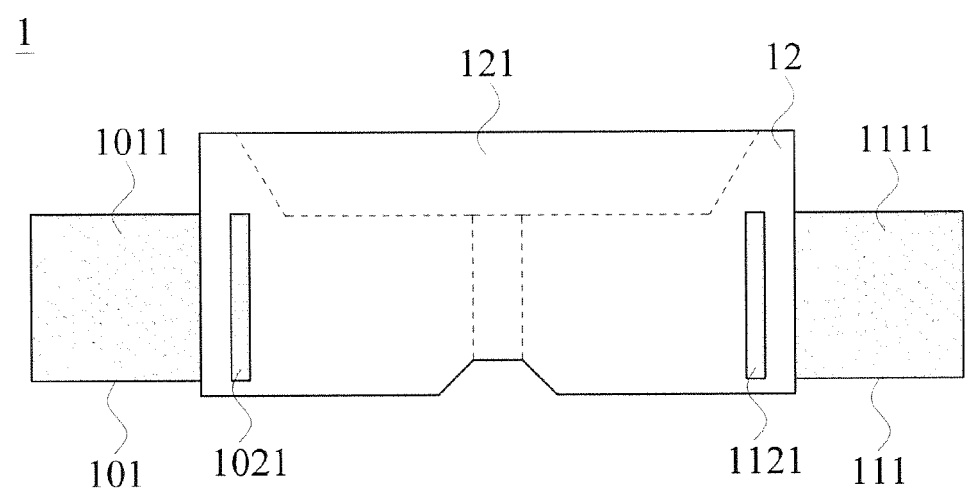
FIG. 4 is a perspective side view of the second preferred embodiment of the present invention.

With reference to FIGS. 3 and 4 for the cross-sectional view and a side view of an LED bracket in accordance with the second preferred embodiment of the present invention respectively, the LED bracket 1 of this embodiment is substantially the same as the LED bracket of the first preferred embodiment and also comprises a first metal sheet 10, a second metal sheet 11 and a casing 12, wherein the casing 12 is coupled to the first metal sheet 10 and the second metal sheet 11 by an injection molding method and has a receiving slot 121. The difference between this preferred embodiment and the first preferred embodiment resides on that at least one first support portion 1021 and at least one second support portion 1121 are extended outwardly and respectively from the first carrying end 102 and the second carrying end 112, and the first support portion 1021 and the second support portion 1121 are quadrilateral prism and coupled to a sidewall of the casing 12 and slightly protruded out from an external side of the casing 12, so that the adhesiveness of the first metal sheet 10 and the second metal sheet 11 with the casing 12 is enhance, and the first support portion 1021 and the second support portion 1121 are respectively and integrally formed with the first metal sheet 10 and the second metal sheet 11, and their height is equal to the thickness of the first metal sheet 10 and the second metal sheet 11. In this preferred embodiment, there are a plurality of first support portions 1021 and a plurality of second support portions 1121, and the first metal sheet 10 has at least one first auxiliary combining portion 103, and the second metal sheet 11 has at least one second auxiliary combining portion 113. Preferably, there are a plurality of first auxiliary combining portions 103 and a plurality of second auxiliary combining portions 113 which are prism with a rectangular cross-section, and the first auxiliary combining portion 103 and the second auxiliary combining portion 113 are respectively and integrally formed with the first metal sheet 10 and the second metal sheet 11. In FIG. 3, there is a plurality of first gaps 104 formed between the first support portions 1021 and the first auxiliary combining portions 103, and a plurality of second gaps 114 formed between the second support portions 1121 and the second auxiliary combining portions 113. In the injection molding process of the casing 12, plastic materials flow into the first gaps 104 and the second gaps 114 for the formation, so as to further enhance the strength of fixing the casing 12 with the first metal sheet 10 and the second metal sheet 11 and the structural strength of the LED bracket 1.

Figure 5:
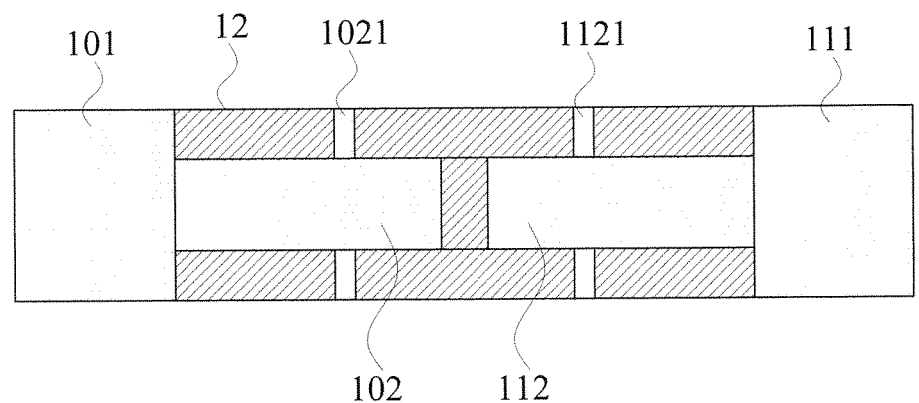
FIG. 5 is a cross-sectional view of a third preferred embodiment of the present invention.
Figure 6:
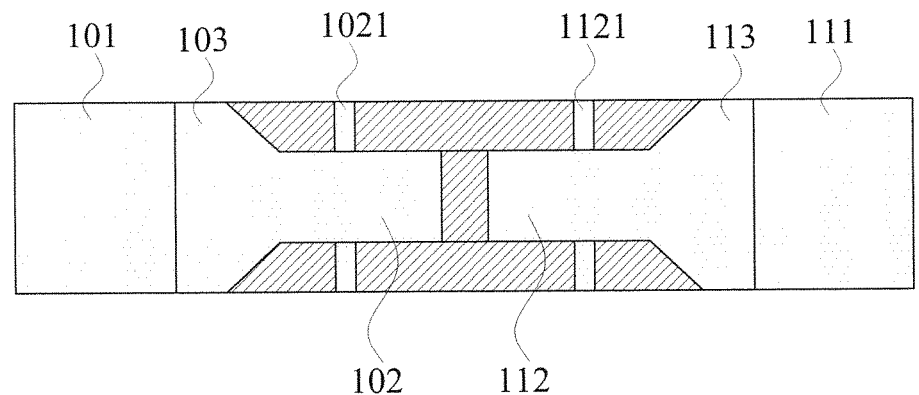
FIG. 6 is a cross-sectional view of another implementation mode of the third preferred embodiment of the present invention.

With reference to FIGS. 5 and 6 for the cross-sectional views of an LED bracket in accordance with different implementation modes of the third preferred embodiment of the present invention respectively, this embodiment is substantially the same as the first and second preferred embodiments except that the first support portion 1021 of the first metal sheet 10 and the second support portion 1121 of the second metal sheet 11 are prism with a rectangular cross-section and extended and coupled to a sidewall of the casing 12 and slightly protruded out from the casing 12, so as to enhance the strength of fixing the first metal sheet 10 and the second metal sheet 11 with the casing 12. Preferably, there are a plurality of first support portions 1021 and a plurality of second support portions 1121 as shown in FIG. 5.

In an implementation mode of this embodiment as shown in FIG. 6, the first metal sheet 10 has at least one first auxiliary combining portion 103, and the second metal sheet 11 has at least one second auxiliary combining portion 113, and the first auxiliary combining portion 103 and the second auxiliary combining portion 113 are prism with a trapezium cross-section. Preferably, the first auxiliary combining portion 103 and the second auxiliary combining portion 113 are disposed at the sides where the first carrying end 102 and the second carrying end 112 are covered by the casing 12 and coupled to the casing 12 respectively, so as to further enhance the adhesive strength of the casing 12 with the first metal sheet 10 and the second metal sheet 11.

In the LED bracket 1 of the present invention, various irregular shapes of the first metal sheet 10 and the second metal sheet 11 are provided for enhancing the strength of fixing the casing 12 with the first metal sheet 10 and the second metal sheet 11 to improve the structural rigidity of the LED bracket 1. In addition, the first pin terminal 101 and the second pin terminal 111 are not bent, so that the casing 12 is no longer limited by the space required for bending the first pin terminal 101 and the second pin terminal 111, and the thickness of the LED bracket may be adjusted and designed freely as needed, and the size and the angle θ of the opening of the receiving slot 121 may also be adjusted freely.

What is claimed is:

1. A light emitting diode (LED) bracket, comprising a first metal sheet, a second metal sheet and a casing, and the casing covering the first metal sheet and the second metal sheet and having a receiving slot, characterized in that the casing partially covers the first metal sheet and the second metal sheet, and the first metal sheet has a first pin terminal and a first carrying end, and the second metal sheet has a second pin terminal and a second carrying end, and the first pin terminal and the second pin terminal are non-bent and arranged substantially opposite to each other and extended outwardly from the casing, and the first carrying end and the second carrying end are disposed in the receiving slot, and at least one first support portion and at least one second support portion are provided for enhancing the strength of fixing the first metal sheet and the second metal sheet with the casing, wherein at least one LED chip is installed at the first carrying end or the second carrying end, or jumped across the first carrying end and the second carrying end, wherein the first support portion and the second support portion are disposed at the bottom of the first carrying end and the second carrying end respectively and inwardly and concavely formed.

2. The LED bracket as claimed in claim 1, wherein the first carrying end and the second carrying end are symmetrically disposed in the receiving slot.

* * * * *